(12) United States Patent
Slocum et al.

(10) Patent No.: US 10,241,224 B2
(45) Date of Patent: Mar. 26, 2019

(54) SYSTEM AND METHOD FOR AIRBORNE GEOPHYSICAL EXPLORATION

(71) Applicant: Slocum Geophysics, LLC, Richardson, TX (US)

(72) Inventors: Robert E. Slocum, Richardson, TX (US); Gary T. Kuhlman, Plano, TX (US)

(73) Assignee: Slocum Geophysics, LLC, Richardson, TX (US)

( * ) Notice: Subject to any disclaimer, the term of this patent is extended or adjusted under 35 U.S.C. 154(b) by 100 days.

(21) Appl. No.: 15/660,598

(22) Filed: Jul. 26, 2017

(65) Prior Publication Data

US 2019/0018164 A1    Jan. 17, 2019

Related U.S. Application Data

(60) Provisional application No. 62/369,619, filed on Aug. 1, 2016.

(51) Int. Cl.
| | |
|---|---|
| *G01V 3/16* | (2006.01) |
| *G01R 33/022* | (2006.01) |
| *G01V 3/40* | (2006.01) |
| *G01V 3/08* | (2006.01) |
| *G01R 33/26* | (2006.01) |

(52) U.S. Cl.
CPC ............ *G01V 3/16* (2013.01); *G01R 33/022* (2013.01); *G01R 33/26* (2013.01); *G01V 3/081* (2013.01); *G01V 3/087* (2013.01); *G01V 3/40* (2013.01)

(58) Field of Classification Search
CPC ............. G01V 3/16; G01V 5/025; G01V 7/16
USPC .................... 324/330–331; 273/360–361
See application file for complete search history.

(56) References Cited

U.S. PATENT DOCUMENTS

| | | | |
|---|---|---|---|
| 2,551,596 A | 5/1951 | Haglund | |
| 2,611,803 A * | 9/1952 | Rumbaugh | G01R 33/10 324/331 |
| 2,626,525 A * | 1/1953 | Heiland | G01V 7/16 73/382 R |
| 2,779,914 A * | 1/1957 | Rumbaugh | G01R 33/10 324/331 |
| 3,042,857 A * | 7/1962 | Ronka | G01S 13/46 324/225 |
| 3,263,161 A | 7/1966 | Ruddock et al. | |

(Continued)

*Primary Examiner* — Patrick Assouad
*Assistant Examiner* — Demetrius R Pretlow
(74) *Attorney, Agent, or Firm* — Scott T. Griggs; Griggs Bergen LLP

(57) ABSTRACT

A system and method for airborne geophysical exploration over the ground are disclosed. In one embodiment of the system, two towing bodies are towed behind an aircraft in flight in a vertically spaced-apart relation above a ground station. Respective magnetometer measurement instruments are located within each of the towing bodies and the ground station. Each magnetometer measurement instrument collects total field magnitude data to contribute to the magnetic vertical gradient data relative to magnetic crustal anomalies of geological origin and variations in an ambient magnetic field above the surface area of the survey. Each magnetometer measurement instrument also collects location, time, and inertial data substantially simultaneously with the total field magnitude data to provide position-correlated measurements thereof.

20 Claims, 3 Drawing Sheets

(56) References Cited

U.S. PATENT DOCUMENTS

| | | | | |
|---|---|---|---|---|
| 3,396,334 A * | 8/1968 | Hearn | G01R 33/022 |
| | | | 324/226 |
| 3,418,568 A * | 12/1968 | Hearn | G01V 3/165 |
| | | | 324/226 |
| 3,536,992 A * | 10/1970 | Dietrich | G01R 33/022 |
| | | | 250/330 |
| 3,563,501 A * | 2/1971 | Jensen | B64D 3/02 |
| | | | 244/79 |
| 3,872,375 A * | 3/1975 | Ronka | G01V 3/165 |
| | | | 244/1 TD |
| 3,976,937 A * | 8/1976 | Hearn | G01V 3/165 |
| | | | 324/331 |
| 4,435,981 A * | 3/1984 | Carson | G01V 7/16 |
| | | | 324/331 |
| 4,628,266 A * | 12/1986 | Dzwinel | G01V 3/165 |
| | | | 324/330 |
| 4,780,672 A | 10/1988 | McGregor | |
| 5,036,278 A | 7/1991 | Slocum | |
| 5,602,475 A | 2/1997 | Bohler | |
| 5,722,618 A * | 3/1998 | Jacobs | B64D 1/00 |
| | | | 244/137.1 |
| 6,255,825 B1 * | 7/2001 | Seigel | G01V 3/165 |
| | | | 324/326 |
| 7,365,544 B2 * | 4/2008 | McCracken | G01V 3/16 |
| | | | 250/253 |
| 8,358,967 B1 * | 1/2013 | Rebolledo | H04B 7/18504 |
| | | | 342/9 |
| 9,231,296 B2 * | 1/2016 | Duncan | H01Q 1/30 |
| 9,846,255 B2 * | 12/2017 | Wheelock | G01V 3/165 |
| 2008/0211506 A1 * | 9/2008 | Klinkert | H01Q 1/28 |
| | | | 324/330 |
| 2010/0007549 A1 * | 1/2010 | Smith | G01S 13/9035 |
| | | | 342/25 A |
| 2010/0194394 A1 * | 8/2010 | Zhdanov | G01V 3/083 |
| | | | 324/335 |
| 2013/0338923 A1 * | 12/2013 | Zhdanov | G01V 3/08 |
| | | | 702/6 |
| 2014/0312905 A1 * | 10/2014 | Wheelock | G01V 3/165 |
| | | | 324/331 |
| 2015/0241590 A1 * | 8/2015 | Miles | G01V 3/17 |
| | | | 324/331 |
| 2016/0306066 A1 * | 10/2016 | Izarra | G01V 3/165 |

* cited by examiner

SYSTEM AND METHOD FOR AIRBORNE GEOPHYSICAL EXPLORATION

CROSS-REFERENCE TO RELATED APPLICATION

This application claims priority from co-pending U.S. Patent Application Ser. No. 62/369,619 entitled "System and Method for Airborne Geophysical Exploration" and filed on Aug. 1, 2016 in the names of Robert E. Slocum and Gary T. Kuhlman; which is hereby incorporated by reference for all purposes.

TECHNICAL FIELD OF THE INVENTION

This invention relates, in general, to airborne geophysical exploration and, in particular, to systems and methods for airborne geophysical exploration that survey portions of the earth's surface for magnetic variations and anomalies therein.

BACKGROUND OF THE INVENTION

Abrupt contrasts in the magnetic susceptibility of adjacent subterranean volumes constitute sources of magnetic disturbances detectable by means of ground or aerial (aeromagnetic) surveys of the earth's magnetic field. Variations in the ambient magnetic field above the earth are due principally to variations in the earth's magnetic field, which varies regionally from about 25,000 nT near the equator to about 70,000 nT near the magnetic poles. Locally, however, the variations in the earth's magnetic field are usually much smaller and depend upon the local magnetic structure of the earth's crust, principally upon the amount of magnetite-bearing rock present in the earth's crust below the aircraft. In conducting magnetic surveys, maps of the magnetic anomalies from magnetic rock formations are prepared from data obtained from measurements of the earth's field by use of a magnetometer, and from such maps, the formation of related structures generating magnetic anomalies are deduced. Accordingly, there is a need for improved systems and methods for airborne geophysical exploration that improve on existing resolutions.

SUMMARY OF THE INVENTION

It would be advantageous to improve on existing resolutions of magnetic survey maps. It would also be desirable to enable a magnometer-based solution that is easily and quickly deployed during airborne geophysical exploration to generate magnetic survey maps of magnetic anomalies. To better address one or more of these concerns, systems and methods for airborne geophysical exploration are disclosed. In one embodiment of the system, two towing bodies are towed behind an aircraft in flight in a vertically spaced-apart relation above a ground station. Respective magnetometer measurement instruments are located within each of the towing bodies and the ground station. Each magnetometer measurement instrument collects total field magnitude data and together measure magnetic vertical gradient data relative to magnetic crustal anomalies of geological origin and variations in an ambient magnetic field above the earth's surface. Each magnetometer system also collects location, time, and inertial data substantially simultaneously with the total field magnitude data to provide position-correlated measurements thereof.

In one embodiment, the magnetometer measurement instrument includes a magnetometer that is an ultra-high resolution aeromagnetic configured laser helium optical scalar magnetometer utilizing a magnetically-driven spin precession (MSP) mode having a cell of metastable helium atoms optically pumped and monitored by a circularly polarized beam of radiation. The total field magnitude data and magnetic vertical gradient data may be measured by tracking the resonance Larmor frequency based on sensing changes in absorption that occur at the magnetic resonance frequency in the optically pumped helium subjected to aRF resonance drive field at the Larmor frequency. These and other aspects of the invention will be apparent from and elucidated with reference to the embodiments described hereinafter.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The specific embodiments discussed herein are merely illustrative of specific ways to make and use the invention, and do not delimit the scope of the present invention.

Figure 1:
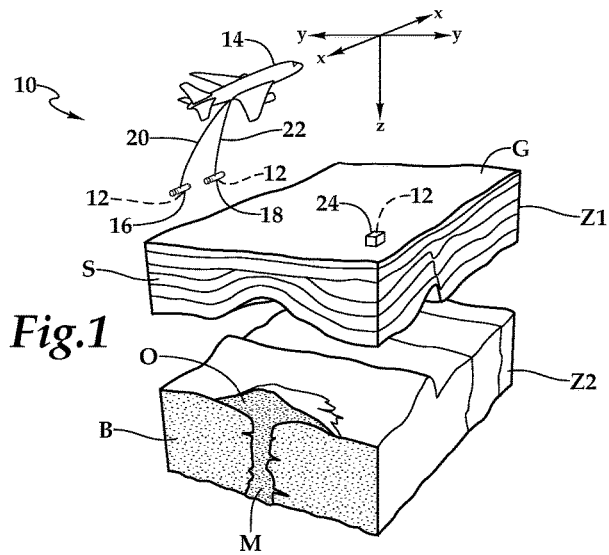
FIG. 1 is a perspective illustration depicting one embodiment of a system for airborne geophysical exploration during an aerial magnetic survey of subterranean formations, according to the teachings presented herein.
Figure 2A:
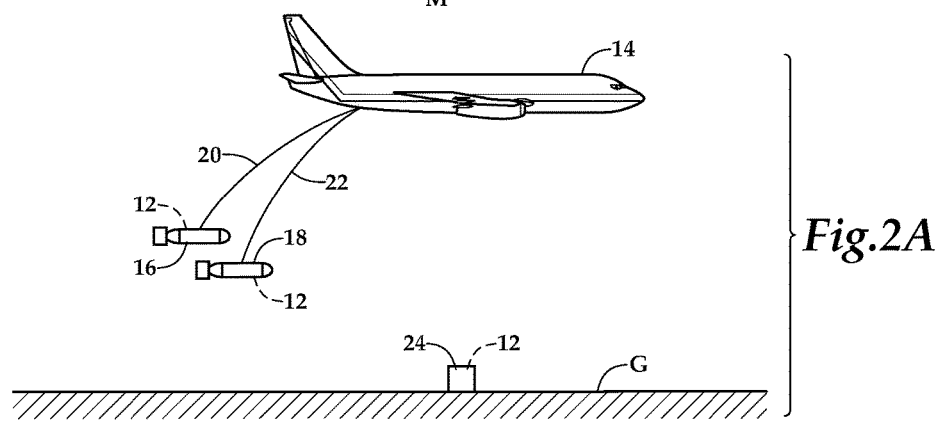
FIG. 2A is a side elevation view depicting a portion of the system presented in FIG. 1 in further detail.
Figure 2B:
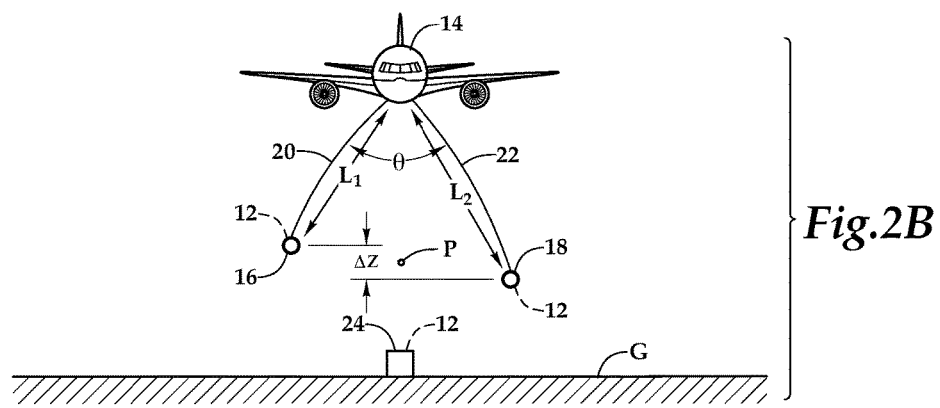
FIG. 2B is a front elevation view depicting a portion of the system presented in FIG. 1 in further detail.

Referring initially to FIGS. 1, 2A, and 2B, therein is depicted one embodiment of a system for airborne geophysical exploration, which is shown in perspective illustration and generally designated 10. Magnetometer measurement instruments 12 are towed behind an aircraft 14 within respective towing bodies 16, 18 in a vertically spaced-apart relation while the aircraft is inflight. The aircraft 14 may be a vehicle such as a fixed-wing aircraft, rotor-wing aircraft, helicopters, and unmanned aerial vehicles. As shown, tow lines 20, 22, which may be cables, for example, respectively secure each of the towing bodies 16, 18 to the aircraft 14. In one implementation, the difference between $L_1$, the length of the tow line 20 associated with the towing body 16 and L2, the length of the tow line 22 associated with the towing body 18, is approximately 40 feet or greater, that is, 40 feet or greater. An angle θ below the tow lines 20, 22 goes to 0 during flight. A magnetometer measurement instrument 12 is also located within a ground station 24 located at surface G. Basement rock B is typically on the order of 10,000 feet below the surface G and below the sedimentary sections S. A portion M of the basement rock B having a contrasting susceptibility gives rise to a magnetic disturbance, which is shown as having an origin O. The x, y, z coordinates of an observation point P, midway between the magnetometer measurement instrument 12 at towing bodies 16, 18, are taken from mutually perpendicular axes x, y, z, with the origin O at the central point of the magnetic disturbance.

More generally, anomalies in the earth's magnetic field caused by subterranean magnetic disturbances are of the general functional form:

$$H=Kr^{-n}, \text{ where } n=1, 2 \text{ or } 3 \qquad \text{[Equation 1]}.$$

In Equation 1, H is the intensity of the anomaly at a distance r from the center of the disturbance and K is a constant for any given disturbance and includes such properties as magnetic susceptibility contrast and size of magnetic body, and n is the fall-off rate with distance r of the intensity of the magnetic disturbance H. Application of Euler's theorem gives the following relationship between the coordinates of an observation point P with respect to the disturbance, the total magnetic anomaly, and the space derivatives of the total magnetic anomaly:

$$x(\partial H/\partial x)+y(\partial H/\partial y)+z(\partial H/\partial z)=nH, \qquad \text{[Equation 2]}.$$

In Equation 2, x, y, z, are the Cartesian coordinates of the observation point P with respect to the center of the disturbance as origin, z being the vertical coordinate and x, y the coordinates in a horizontal plane. According to one embodiment, H and ∂H/∂z are measured using the two vertically displaced magnetometer measurement instruments 12. The reading of either instrument (or for greater accuracy, when desired, the average of these readings) yields H, and the difference ΔH in reading between the two instruments divided by the vertical distance Δz separating the instrument yields ΔH/Δz which is taken as a good approximation to ∂H/∂z. Accuracy can be further improved by using the average of the two vertically displaced magnetometer measurement instruments 12 associated with the towing bodies 16, 18 and utilizing the magnetometer measurement instrument 12 associated with the ground station 24 to provide a baseline of background magnetic signals to improve the signal-to-noise ratio and associated accuracy.

Sedimentary layers in the basins containing hydrocarbons may also have weak magnetic properties that cause subtle disturbances in the magnetic field that can be resolved by high resolution magnetometers and are associated with conditions favorable for oil accumulation. Crustal zones can, for the purposed of this patent discussion of aeromagnetic surveys, be can be divided into two zones. Zone 1 (Z1) extends from the surface to a depth of 2,000 feet. Zone 2 (Z2) extends from 2,000 feet to the basement of the basement which may exceed 12,000 feet. Total magnetic field value H can be measured for magnetic anomalies with the magnetometer measurement instruments 12. This data is used to infer information of the depth and nature of such sources of basement disturbance by assuming that the disturbance arises from a magnetic body of some particular geometrical shape. The measured vertical gradient value ΔH/Δz is also used for magnetic anomaly surveying, and this data is used to infer information of the depth and nature of magnetic anomaly sources in Zone 1 where the magnetic disturbances are caused by shallow magnetic deposits of minerals, metals or natural resource. The measured vertical gradient is observed for magnetic anomalies from both shallow sedimentary and basement layers indicating potential hydrocarbon accumulations.

As shown in FIGS. 1, 2A, and 2B, the aircraft 14 conducts a flight operation that may be grid-like pattern of flight lines over the surface area being subject to the geophysical exploration. During this period of time, data is collected. Additionally, during this time or an extended period of time, data may be collected at the ground station 24. The use of the towing bodies 16, 18 provides for the installation of magnetometers in the towing bodies 16, 18, as will be discussed in further detail below, that permit the aircraft 14 to be operated at higher altitudes. Accordingly, the towing bodies 16, 18 are aerodynamically stable in flight in order to avoid the generation of spurious signals in the magnetometer measurement instruments 12 during flight due to sudden changes in position of the towing bodies 16, 18. It should be appreciated that although a particular airborne geophysical exploration has been described in FIG. 1, other types of airborne geophysical exploration are within the teachings disclosed herein. By way of example and not by way of limitation, the flight operation may include a draped-survey pattern of flight lines over the surface area being subject to the geophysical exploration.

Figure 3:
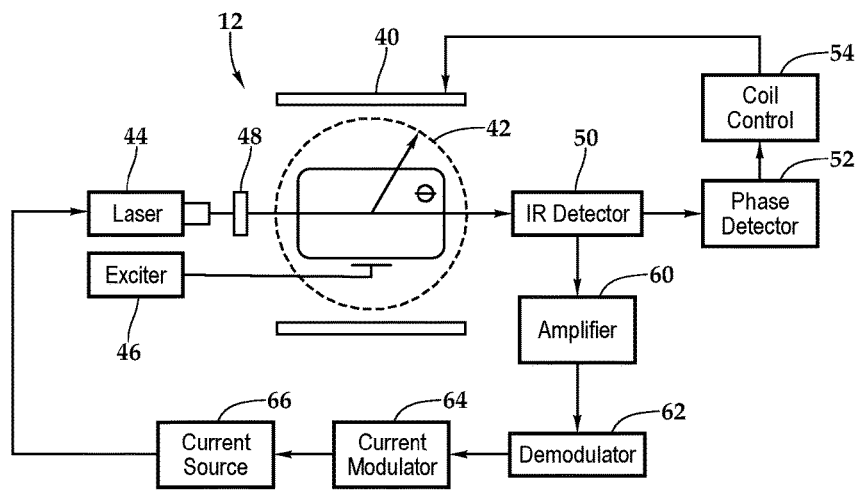
FIG. 3 is a schematic diagram of one embodiment of a scalar magnetometer utilized within the system presented in FIG. 1.

Referring to FIG. 3, in one embodiment, the magnetometer 12 may be a scalar magnetometer including an RF resonance driver coil system 40 having a helium cell 42 that is optically pumped by way of a laser 44 and an exciter 46, with a circular polarizer interposed between the laser 44 and the helium cell 42. The IR detector 50 monitors the magnetic field resonance frequency and provides a feedback loop though a phase detector 52 and a coil control 54 to the RF resonance driver coil system 40. Further, the laser 44 is frequently stabilized by a feedback loop which corrects frequency difference between the laser frequency and the helium absorption frequency. The photocurrent from the IR detector 50 is applied to an amplifier 60 and amplified. The output of the amplifier 60 is applied to a demodulator 62, which may include a narrow band amplifier. The output of the demodulator 62 is applied to a current modulator 64 and then to a current source 66 which adjust the laser drive of the laser 44.

Continuing to refer to FIG. 3, a phenomenological description of the scalar magnetometer 12 using a magnetically-driven spin precession (MSP) locked-oscillator resonance) mode includes the RF resonance drive coil system 40 having a cell of metastable He atoms that are optically pumped by way of the laser 44 and the exciter 46 and monitored by circularly polarized beam of 1083 nm radiation originating from the circular polarizer 48. In the MSP resonance scalar mode, the magnetic field resonance frequency is monitored at the IR detector 50 by sensing changes in the absorption that occur in the optically pumped He subjected to RF resonance drive field that tracks the helium-4 resonance at 28 Hz per nanotesla. A tracking oscillator generates the RF drive fields and is locked to the resonance frequency and monitored to measure the magnetic field.

A beam of circularly polarized 1083 nm radiation pumping the metastable He-4 atoms in the absorption cell is monitored to produce an error signal for locking the oscillator frequency to the resonance frequency of the helium-4. When a varying ambient magnetic field is encountered, the Larmor resonance frequency of the helium-4 varies and the tracking oscillator follows this frequency variation which is proportional to the scalar magnitude of the magnetic field with a proportional constant at 28 Hz/nT.

In one implementation, the on-the-ground resolution of the scalar magnetometer measurement device 12 is 0.3 picoteslas. Conventional alkali vapor survey magnetometers have inflight sensitivity of only 10 picotesla. The inflight resolution of the magnetometer measurement device 12 is a factor of 33 improvement. As previously alluded, the vertical gradiometer resolution is defined as $\Delta H/\Delta z$ where $\Delta H$ is the inflight resolution of the magnetometers and $\Delta z$ is the vertical separation of the two magnetometer measurement devices. The conventional vertical gradiometer system has a resolution of 10 picotesla/8 feet or 1.25 picotesla per foot. The inflight resolution of the magnetometer measurement device employed herein as a vertical gradiometer is 0.0033 picotesla per foot, which is a factor of 375 improvement.

Further, sensor stability is essential for operation of a vertical gradiometer. The conventional alkali vapor survey magnetometers are degraded by false field variations caused by temperature fluctuations of the resonance cell during operation and large heading errors caused by hyperfine light shifts of the resonance frequency. The laser helium-4 optical magnetometers employed herein have exceptional stability evidenced by placing two laser helium magnetometers in operation in an ambient magnetic field of 50,000 nanotesla, differencing the output frequency and observing the scalar sensors are stable to better than 0.3 picotesla resolution. This represents a stability of 1 part in 167,000,000, so the inflight vertical gradiometer performance is not degraded by lack of stability.

The aforementioned vertical gradiometer improvement of 375 can be transformed in to a range improvement calculation for the gradiometer presented herein relative to the conventional vertical gradiometer defined by the Canadian Geological Survey (CGS). For a dipole magnetic source, the range of a conventional vertical gradiometer (system 1) with resolution $\Delta H_1$ is $z_1$. The range of the UHR gradiometer (system 2) with resolution $\Delta H_2$ is $z_2$. The gradiometer signal for the dipole anomaly typically falls off as $1/z^4$, and it is this rapid falloff of intensity with distance that has limited conventional vertical gradiometers to shallow surveys in Zone 1. A comparison of ranges for dipole anomalies can be estimated with the equation $z_2/z_1 = (\Delta H_1/\Delta H_2)^{1/4}$. The range $z_2$ is 4.4 times $z_1$ thus satisfying UHR condition of twice the conventional range $z_1$. The Geological Survey of Canada (GSC) designates the effective range of their standard magnet gradiometers as covering depths from the surface to approximately 2,000 feet (Zone 1). The improvement in range of the system presented herein extends the effective vertical gradiometer range 9,000 feet to greater than 13,000 feet which is extremely important for petroleum exploration with a vertical gradiometer.

The magnetic field total intensity and measured vertical gradient data can be used to construct ultra-high resolution total magnetic field maps and measured vertical gradient maps as well as total magnetic field profiles and measured vertical magnetic gradient profiles along the flight direction for geophysical prospecting. The data can be processed by those skilled in the state-of-the-art to apply conventional aeromagnetic signal processing procedures used in commercial aeromagnetic surveys such as but not restricted to reduce to pole, depth to anomaly, spatial filtering, tilt derivatives and formation of combinations of calculated vertical and horizontal derivatives.

Figure 4:
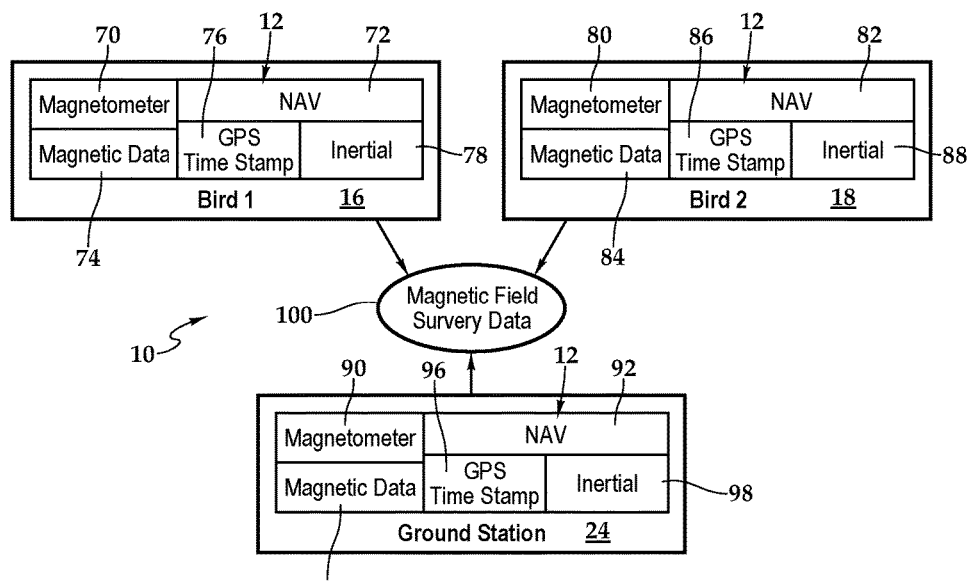
FIG. 4 is a data flow diagram of one embodiment of a graphical representation of magnetic field survey data processing, which forms a portion of the system presented in FIG. 1.

Referring to FIG. 4, as discussed, the towing bodies 16, 18 are configured to be towed behind an aircraft, such as the aircraft 14, in flight in a vertically spaced-apart relation, the towing bodies 16, 18, labeled as Bird 1 and Bird 2, include magnetometer measurement instruments 12. The ground station 24 located at a surface of the ground also includes a magnetometer measurement instrument 12.

The magnetometer measurement instrument 12 at the towing body 16 includes a magnetometer 70 and a navigational apparatus 72. The magnetometer 70 is configured to collect magnetic data 74 including total field magnitude data to contribute to magnetic vertical gradient data relative to magnetic crustal anomalies of geological origin and variations in an ambient magnetic field above the ground. As discussed, in one embodiment, the magnetometer 70 may be an ultra-high resolution aeromagnetic configured laser helium optical scalar magnetometer utilizing an MSP resonance locked-oscillator mode having a cell of metastable helium atoms optically pumped and monitored by a circularly polarized beam of radiation. The magnetic data 74 includes total field magnitude to contribute to magnetic vertical gradient data measured as the resonance frequency of the magnetometer's tracking oscillator frequency.

The navigational apparatus 72 is configured to collect location, time, and inertial data substantially simultaneously with the magnetic data 74 to provide position-correlated measurements thereof. As shown in FIG. 4, the location, time, and inertial data are represented by the GPS time stamp data 76 and the inertial data 78. The magnetometer measurement instrument 12 within the towing body 18 is similar to the magnetometer measurement instrument 12 within the towing body 16. A magnetometer 80 and navigational apparatus 82 are included. The magnetometer 80 collects magnetic data 84 such as total field magnitude data to contribute to magnetic vertical gradient data. The navigational apparatus 82 collects the location, time, and inertial data as represented by the GPS time stamp data 86 and the inertial data 88.

Similarly still, the magnetometer measurement instrument 12 within the ground station 24 includes a magnetometer 90 and navigational apparatus 92. The magnetometer 90 collects magnetic data 94 such as total field magnitude data. The navigational apparatus 92 collects the location, time, and inertial data as represented by the GPS time stamp data 96 and the inertial data 98. In one implementation, the ground station 24 is located proximate to the center of the area to be surveyed. Further, in one implementation, the ground station 24 collects the magnetic data 94, GPS time stamp data 96, and the inertial data 98 over a period of time to provide a baseline of atmospheric and background magnetic signals in the area to be surveyed. The various types of data from the towing body 16, towing body 18, and the ground station 24 are combined to provide magnetic field survey data 100, which may be further processed to produce various types of plots, as will be discussed in further detail hereinbelow.

Figure 5:
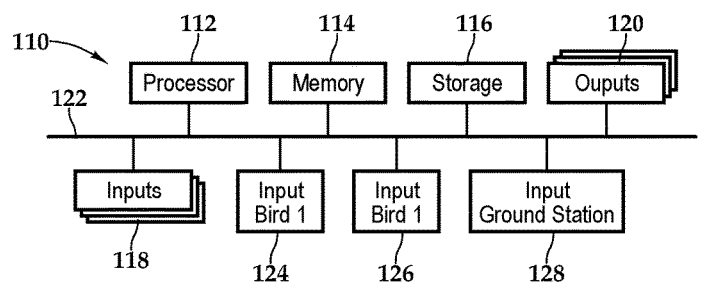
FIG. 5 is a functional block diagram of one embodiment of a computing device that facilitates the magnetic field survey data processing presented in FIG. 5.

Referring to FIG. 5, a computing device 110, which forms a portion of the system 10, may include a processor 112, memory 114, storage 116, inputs 118, and outputs 120 that are interconnected by a bus architecture 122 within a mounting architecture. The inputs 118 may include several specific inputs, such as an input 124 for the magnetometer measurement instrument 12 associated with the towing body 16, an input 126 for the magnetometer measurement instrument 12 associated with the towing body 18, and an input 128 for the magnetometer measurement instrument 12 associated with the ground station 24. The processor 112 may process instructions for execution within the computing device 110, including instructions stored in the memory 114 or in the storage 116. The memory 114 stores information within the computing device 110. In one implementation, the memory 114 is a volatile memory unit or units. In another implementation, the memory 114 is a non-volatile memory unit or units. The storage 116 provides capacity that is capable of providing mass storage for the computing device 110. The various inputs 118 and outputs 120 provide connections to and from the computing device 110, wherein the inputs 110 are the signals or data received by the computing device 110, and the outputs 120 are the signals or data sent from the computing device 110.

The memory 114 and the storage 116 are accessible to the processor 112 and include processor-executable instructions that, when executed, cause the processor 112 to execute a series of operations. The processor-executable instructions cause the computing device 110 to receive at the inputs 124, 126, 128 the total field magnitude data, which contributes to the magnetic vertical gradient data, and the location, time, and inertial data from each of the magnetometer measurement instruments 12. The vertical gradient of the total field is taken as the magnetic field intensity of the upper sensor (e.g., the magnetometer 70 within the towing body 16) minus that at the lower sensor (e.g., the magnetometer 80 within the towing body 18) divided by the vertical separation distance $\Delta z$. The sign of the vertical gradient is normally changed to simplify quantitative interpretation. The processor-executable instructions then cause the processor to process the total field magnitude data, and the location, time, and inertial data from each of the magnetometer measurement instruments 12 to generate the magnetic vertical gradient data. This processing step may include adjusting for background noise or interpolating data. By way of example, the magnetic data from the magnetometer measurement instrument 12 associated with the ground station 24 may be utilized as background or irrelevant data to adjust the magnetic field survey data relative to the magnetometer measurement instruments 12 associated with the towing bodies 16, 18. The processor-executable instructions may then generate a total field and vertical gradient plot. The total field and vertical gradient plot may be a total field and vertical gradient Cartesian plot or a total field and vertical gradient contour plot, for example.

Figure 6:
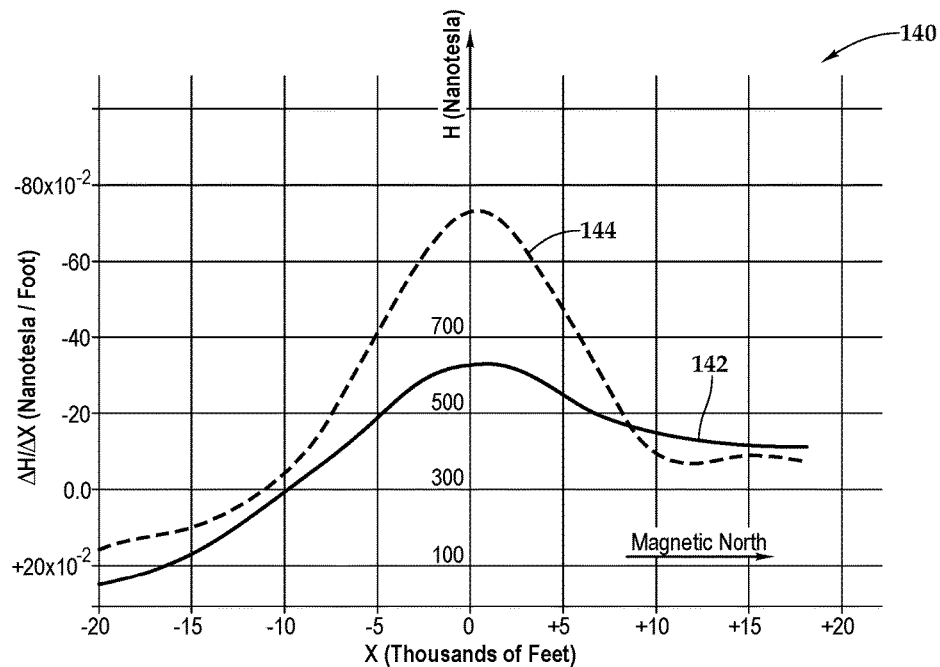
FIG. 6 is a total field and vertical gradient Cartesian plot constructed in accordance with the teachings presented herein.

Referring to FIG. 6, a plot 140 includes an H profile (solid line) 142 and a $\Delta H/\Delta z$ profile (broken line) 144 that are constructed on rectangular coordinates from position-correlated measurements taken along a flight line at a specified altitude, utilizing the teachings presented herein. The improved resolution of the data permits collection of total field magnitude data and vertical gradient data offer the geophysical exploration industry the measured total field magnetic anomalies from the pre-Cambrian basement magnetic anomalies that are observed in the magnetic data with more than ten times better resolution that that of conventional aeromagnetic survey systems. The measured vertical gradients of magnetic anomalies from the pre-Cambrian basement anomalies are observed with resolution more than 350 times better that that of conventional aeromagnetic vertical gradiometer survey systems. Generally, magnetic explorations or surveys in which the gradient of the magnetic field is calculated is found to be lacking in resolution compared to the measured vertical gradient. The calculated magnetic gradient for magnetic anomalies have not been entirely satisfactory for the reason that data obtained by such methods is insufficiently detailed and accurate for preparing magnetic maps which can be correlated to reveal detailed structure of the magnetic anomalies.

The total field data collected herein provides more sharply defined profiles and maps than conventional aeromagnetic data. Further, the data collected by the systems and methods presented herein offers further improvements of resolution of magnetic anomalies by combining the measured vertical gradient data with the total field data from the same magnetic anomaly.

Utilizing the systems and methods presented herein, the extended range of the gradiometer enhances resolution of magnetic anomalies in Zone 1 for aeromagnetic surveys where the aircraft is prevented from flying at desired low altitudes by elevated physical obstacles (manmade restrictions, trees, populated areas, wind generators, towers, forests, mountains etc.) required to observe vertical magnetic gradients in Zone 1. In these cases the system permits resolution comparable with conventional survey systems flying at lower altitudes. In these regions where the aircraft is restricted to higher altitude flight paths, geologic magnetic anomalies can be observed at the higher flight altitude with the same or better resolution as the conventional gradiometer flown closer to the ground surface.

The extended range of the magnetometer and gradiometer is also useful in Zone 1 aeromagnetic surveys where the aircraft is flying at the desired low altitudes to observe vertical magnetic gradients from magnetic anomalies in Zone 1. In these cases the system resolution significantly exceeds that of a conventional survey systems flying at the identical lower altitudes. The extended gradiometer range reaches into the region less than 2,000 feet below the surface with more than 350 times the vertical gradient resolution of commercial gradiometers to map with great precision shallow geologic formations containing gems, minerals and metals. Since the accepted range of conventional vertical gradiometers is limited to Zone 1, an important goal for petroleum exploration is extension of the measured vertical gradiometer range to Zone 2 for mapping of sedimentary anomalies in the 2,000 feet to 12,000 feet depth range and beyond. The measured vertical gradiometer range of the U-HRAM achieves this goal and opens Zone 2 to vertical gradiometer mapping and profile data collection along the flight path.

The order of execution or performance of the methods and techniques illustrated and described herein is not essential, unless otherwise specified. That is, elements of the methods and techniques may be performed in any order, unless otherwise specified, and that the methods may include more or less elements than those disclosed herein. For example, it is contemplated that executing or performing a particular element before, contemporaneously with, or after another element are all possible sequences of execution.

While this invention has been described with reference to illustrative embodiments, this description is not intended to be construed in a limiting sense. Various modifications and combinations of the illustrative embodiments as well as other embodiments of the invention, will be apparent to persons skilled in the art upon reference to the description. It is, therefore, intended that the appended claims encompass any such modifications or embodiments.

What is claimed is:

1. A system for airborne geophysical exploration over a survey surface area, the system comprising:
first and second towing bodies configured to be towed behind an aircraft in flight in a vertically spaced-apart relation, the first and second towing bodies including respective first and second magnetometer measurement instruments;

a ground station located at a surface of the ground, the ground station including a third magnetometer measurement instrument;

each of the first, second and third magnetometer measurement instruments comprising:

a magnetometer configured to collect total field magnitude data to contribute to magnetic vertical gradient data relative to magnetic crustal anomalies of geological origin and variations in an ambient magnetic field above the ground, and a navigational apparatus configured to collect location, time, and inertial data substantially simultaneously with the total field magnitude data to provide position-correlated measurements thereof; and the first, second, and third magnetometer measurement instruments being activated during a flight operation of the aircraft over the ground being subject to the geophysical exploration.

2. The system as recited in claim 1, wherein the aircraft further comprise a vehicle selected from the group consisting of fixed-wing aircraft, rotor-wing aircraft, helicopters, and unmanned aerial vehicles.

3. The system as recited in claim 1, wherein the vertically spaced-apart relation further comprises approximately at least 40 feet.

4. The system as recited in claim 1, wherein the flight operation further comprises an operation selected from the group consisting of grid-like pattern of flight lines over the ground being subject to the geophysical exploration, and draped-survey pattern of flight lines over the ground being subject to the geophysical exploration.

5. The system as recited in claim 1, wherein the first, second, and third magnetometers further comprise ultra-high resolution aeromagnetic configured laser helium-4 optical magnetometers.

6. The system as recited in claim 1, wherein the first, second, and third magnetometers further comprise scalar magnetometers utilizing a magnetically-driven spin precession (MSP) resonance locked-oscillator mode having a cell of metastable helium atoms optically pumped and monitored by a circularly polarized beam of radiation.

7. The system as recited in claim 6, wherein the total field magnitude data and magnetic vertical gradient data are measured by sensing changes in absorption that occur in the optically pumped helium subjected to a RF resonance field produced by the locking oscillator.

8. The system as recited in claim 6, wherein the polarized beam further comprises approximately 1083 nm radiation.

9. The system as recited in claim 6, wherein the magnetometer further comprises a self-oscillator rather than a locked-oscillator mode of operation.

10. The system as recited in claim 1, wherein the magnetometer further comprises an inflight resolution of 0.3 picotesla.

11. The system as recited in claim 1, wherein the magnetometer further comprises a vertical gradiometer range of approximately 13,000 feet.

12. A system for airborne geophysical exploration over the ground, the system comprising:

first and second towing bodies configured to be towed behind an aircraft in flight in a vertically spaced-apart relation, the first and second towing bodies including respective first and second magnetometer measurement instruments;

a ground station located at a surface of the ground, the ground station including a third magnetometer measurement instrument;

each of the first, second and third magnetometer measurement instruments comprising:

a magnetometer configured to collect total field magnitude data to contribute to magnetic vertical gradient data relative to magnetic crustal anomalies of geological origin and variations in an ambient magnetic field above the ground, the magnetometer being an ultra-high resolution aeromagnetic configured laser helium optical scalar magnetometer utilizing a magnetically-driven spin precession (MSP) resonance locked-oscillator resonance mode having a cell of metastable helium-4 atoms optically pumped and monitored by a circularly polarized beam of radiation, the total field magnitude data are measured by sensing changes in absorption that occur in the optically pumped helium used to lock a tracking oscillator to the resonance frequency of the helium-4 gas, and a navigational apparatus configured to collect location, time, and inertial data substantially simultaneously with the total field magnitude data to provide position-correlated measurements thereof; and the first, second, and third magnetometer measurement instruments being activated during a flight operation of the aircraft over the surface area being subject to the geophysical exploration.

13. The system as recited in claim 12, wherein the vertically spaced-apart relation further comprises approximately at least 40 feet.

14. The system as recited in claim 12, wherein the magnetometer further comprises an inflight resolution of 0.3 picotesla.

15. The system as recited in claim 12, wherein the magnetometer further comprises a vertical gradiometer range of approximately 13,000 feet.

16. A system for airborne geophysical exploration over the ground, the system comprising:

first and second towing bodies configured to be towed behind an aircraft in flight in a vertically spaced-apart relation, the first and second towing bodies including respective first and second magnetometer measurement instruments;

a ground station located at a surface of the ground, the ground station including a third magnetometer measurement instrument;

each of the first, second and third magnetometer measurement instruments comprising:

a magnetometer configured to collect total field magnitude data to contribute to magnetic vertical gradient data relative to magnetic crustal anomalies of geological origin and variations in an ambient magnetic field above the ground, the magnetometer being an ultra-high resolution aeromagnetic configured laser helium optical vector magnetometer utilizing a magnetically-driven spin precession (MSP) resonance locked-oscillator resonance mode having a cell of metastable helium-4 atoms optically pumped and monitored by a circularly polarized beam of radiation, the total field magnitude data are measured by sensing changes in absorption that occur in the optically pumped helium used to lock a tracking oscillator to the resonance frequency of the helium-4 gas, and a navigational apparatus configured to collect location, time, and inertial data substantially simultaneously with the total field magnitude data to provide position-correlated measurements thereof;

the first, second, and third magnetometer measurement instruments being activated during a flight operation of the aircraft over the ground being subject to the geophysical exploration;

a post-survey computing device including a processor, memory, and an input communicatively interconnected by a busing architecture; and the memory accessible to the processor, the memory including processor-executable instructions that, when executed, cause the processor to:

receive at the input the total field magnitude data, and the location, time, and inertial data from each of the first, second, and third magnetometers, process the total field magnitude data, and the location, time, and inertial data from each of the first, second, and third magnetometers to generate the magnetic vertical gradient data, and generate a total field and vertical gradient plot.

17. The system as recited in claim 16, wherein the total field and vertical gradient plot further comprises a total field and vertical gradient Cartesian plot.

18. The system as recited in claim 16, wherein the total field and vertical gradient plot further comprises a total field and vertical gradient contour plot.

19. The system as recited in claim 16, wherein the vertically spaced-apart relation further comprises approximately at least 40 feet.

20. The system as recited in claim 16, wherein the magnetometer further comprises an inflight resolution of 0.3 picotesla.

* * * * *